United States Patent
Oberai et al.

(10) Patent No.: US 8,255,865 B2
(45) Date of Patent: Aug. 28, 2012

(54) SIGNAL TRACING THROUGH BOARDS AND CHIPS

(75) Inventors: Ankush Oberai, Fremont, CA (US); Scott Shen, Castro Valley, CA (US)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/016,076

(22) Filed: Jan. 28, 2011

(65) Prior Publication Data

US 2011/0191742 A1    Aug. 4, 2011

Related U.S. Application Data

(60) Provisional application No. 61/300,662, filed on Feb. 2, 2010.

(51) Int. Cl.
*G06F 11/22* (2006.01)
*G06F 17/50* (2006.01)
*G06F 15/04* (2006.01)

(52) U.S. Cl. .......................... 716/137; 716/136; 716/139

(58) Field of Classification Search .................. 716/136, 716/137, 139
See application file for complete search history.

(56) References Cited

U.S. PATENT DOCUMENTS

| | | | |
|---|---|---|---|
| 2008/0141194 A1* | 6/2008 | Kumagai | 716/5 |
| 2008/0301600 A1* | 12/2008 | Kumagai | 716/5 |
| 2009/0310870 A1 | 12/2009 | Monkowski | |
| 2011/0113394 A1* | 5/2011 | Woods | 716/106 |

OTHER PUBLICATIONS

"Magma Announces BoardView: Extends Chip-Based Navigation to Circuit- and Board-Level Debug—Traces Signals Between Chips, PCBs, or MCMs, Speeding Board-Level Failure Analysis," Press Release from Nov. 16, 2009.
"Knights Camelot, Camelot is a next-generation CAD navigation system and key component of Magma's Fab Analysis product line," dated Jul. 2008.
"BoardView," dated Nov. 2009.

\* cited by examiner

*Primary Examiner* — Suresh Memula
(74) *Attorney, Agent, or Firm* — Adams Intellex, PLC

(57) ABSTRACT

Signal tracing across boards and chips can be used to greatly enhance failure analysis of the boards and chips. Concepts are disclosed for tracing one or more signal lines across a board, across a chip boundary, and across a chip. Signals may be traced through active circuitry on a chip along with paths through various logic cones. The result can be graphically and interactively presented.

38 Claims, 7 Drawing Sheets

SIGNAL TRACING THROUGH BOARDS AND CHIPS

RELATED APPLICATIONS

This application claims the benefit of the U.S. provisional patent application "Signal Tracing Through Boards and Chips" Ser. No. 61/300,662, filed Feb. 2, 2010. The foregoing application is hereby incorporated by reference in its entirety.

FIELD OF INVENTION

This application relates generally to failure analysis and more particularly to signal tracing across boards and chips.

BACKGROUND

Printed circuit boards and the semiconductor chips attached to them are each vastly complex structures. A printed circuit board (PCB) can have numerous chips attached to it. Each chip can, in turn, have a different function but the operations of the chips interact with one another to provide an overall operation for the printed circuit board. Similar types of interactions are possible with multi-chip modules and stacked chip packages. In each of these cases one package level, such as a printed circuit board, has interconnections for a second package level, such as a semiconductor chip. When a printed circuit board, or some chip mounted on it, fails to operate correctly, identification of the defect can be very problematic. A single chip may have hundreds of millions of transistors or more on it. A printed circuit board may have thousands of wires or more on it.

There remains a need for improved failure analysis evaluation of printed circuit boards having mounted semiconductor chips.

SUMMARY

Signal tracing across boards may help to identify defective signals on boards, chips, and across the boundary interface between the boards and chips. Signal tracing involves the identification and tracking of wires and circuitry that carries a signal across a board, a chip, and other packaging. Failure analysis includes the evaluation and determination of cause of defective operation in electronic circuitry. The failure analysis can include identification of defects on boards and chips. By using signal tracing, failure analysis can be performed to track wires and circuitry to identify where a defect exists in the wires or circuitry.

A computer implemented method is disclosed for failure analyzing circuit boards comprising: importing a first layout for a first package level; importing a second layout for a second package level, wherein the second package level includes an electrical attachment to the first package level; tracing a signal path across the first layout through the electrical attachment and across the second layout; and displaying the signal path. The first package level may include a printed circuit board. The second package level may include a semiconductor chip. The first package level may include a semiconductor chip. The second package level may include a printed circuit board. The method may include tracing the signal through active circuitry on a chip. The active circuitry may include a transistor. Tracing the signal path may include tracing the signal path through a diffusion on a chip. Tracing the signal may include tracing the signal path through a polysilicon element on a chip. Tracing the signal may include tracing the signal path through an electrostatic discharge protection device on a chip. The method may include identifying a cone of logic associated with the signal.

In some embodiments, the method may include importing a netlist, for one of the first package level and the second package level, and wherein the netlist is for a board. The method may include importing a netlist, for one of the first package level and the second package level, and wherein the netlist is for a chip. The method may further comprise importing a schematic, for one of the first package level and the second package level, and highlighting the signal path that was traced. The method may include tracing the signal path through a stacked chip package. The method may include extracting chip boundary and chip pad circuitry on one of the first package level and the second package level. The method may include simulating a portion of the first package level and a portion of the second package level. The method may include storing simulation results from the simulating the portion of the first package level and the portion of the second package level. The method may include aligning test equipment with the signal path which was traced across a board. The method may include navigating test equipment to inspect a potential failure point related to the signal path. The method may include probing a signal line on a board. The method may include using a focused ion beam to place a probe point on the signal on a board. The method may include providing a three-dimensional display of the first package level and the second package level and the signal path which was traced. The method may include detecting a failure point for the signal path. The method may include storing an image of the signal path on the first package level and the second package level.

In embodiments, a computer program product embodied in a non-transitory computer readable medium for performing circuit board analysis comprising: code for importing a first layout for a first package level; code for importing a second layout for a second package level, wherein the second package level includes an electrical attachment to the first package level; code for tracing a signal path across the first layout through the electrical attachment and across the second layout; and code for displaying the signal path.

In embodiments, a system for performing circuit board analysis comprising: a memory for storing instructions; one or more processors attached to the memory wherein the one or more processors are configured to: import a first layout for a first package level; import a second layout for a second package level, wherein the second package level includes an electrical attachment to the first package level; trace a signal path across the first layout through the electrical attachment and across the second layout; and display the signal path.

Various features, aspects, and advantages of various embodiments will become more apparent from the following further description.

BRIEF DESCRIPTION OF THE DRAWINGS

The following detailed description of certain embodiments thereof may be understood by reference to the following figures wherein.

DETAILED DESCRIPTION

The present disclosure provides a description of various methods and systems associated with performing signal tracing on boards and chips and other levels of electronic packaging. Signal tracing is a key portion of performing detailed failure analysis of boards and semiconductors. Signal tracing may also be used to track signals through passive components on a board. According to the systems and methods described herein, one may be able to identify a defect location by tracing a signal across components and one or more boards. Other advantages will become evident as the details are described. Throughout this disclosure, tracing may be considered to be the determination of a connection through a wire or other structure so that a digital or analog signal (or signal derived from a preceding signal or generated to a succeeding signal) path may be determined. Also, tracing may be considered identifying an electrical or logical connection and determining the path over which a signal propagates. Tracing can include identifying upstream and downstream logic paths.

Figure 1:
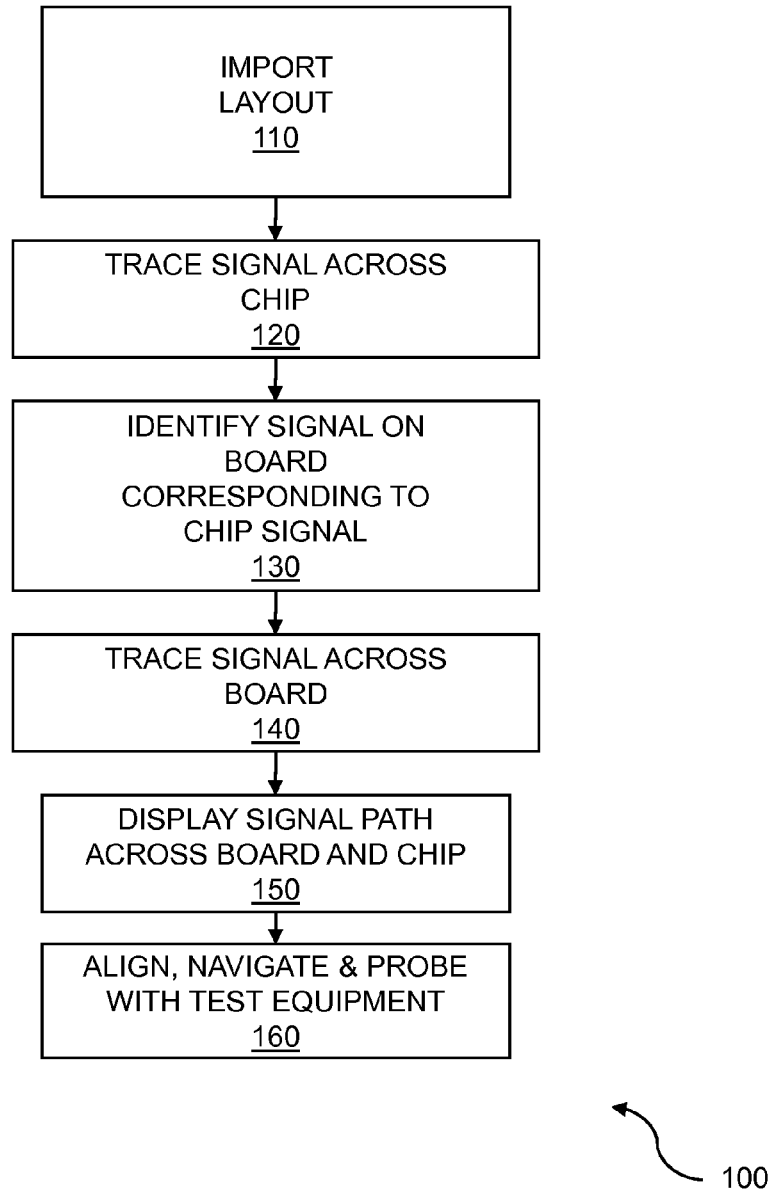
FIG. 1 is a flowchart for signal tracing across a board and chip.

FIG. 1 is a flowchart for signal tracing across a board and chip. The computer implemented method may be used for failure analyzing circuit boards. The process 100 begins with importing of a layout 110. The process may include importing a layout for a first package level, such as a printed circuit board layout. The process may include importing a layout for a second package level, wherein the second package level is electrically attached to the first package level, such as a chip layout. In some embodiments a plurality of chip layouts may be imported. In other embodiments one or more other package level layouts may be imported in place of one or both of the board layout and the chip layout. In this case, one level of packaging for the electronic circuitry may be the chip level. Another level of packaging may be the board level. Other example level layouts include multi-chip module package layouts and stacked chip package layouts. Alternatively, the first package level may be a printed circuit board. The second package level may be a semiconductor chip. The first package level may be a semiconductor chip. The second package level may be a printed circuit board. A variety of level layouts are possible.

The process 100 includes tracing a signal across the layout of the first package level, such as a chip or board 120. A signal may be selected from a menu of all, or a subset of, the signals available. All signals may be traced for current or future use during analysis of the chip or board. Once the signal is traced across the chip or board it will reach a boundary. For example, if a signal trace is started on a chip then at the chip boundary, the signal may be traced onto the board. The process may include tracing the signal through a stacked chip package.

The process 100 includes indentifying the signal 130, which was traced across the layout of the first package level, on the second package level. At the boundary of the package, in one embodiment a chip, the signal on the board may be identified. The signal on the other level of packaging, in one embodiment a board, may be found by searching through the signals on the board. A "find" operation to identify the signal on the other level of packaging may be accomplished by searching based on signals known to be attached to a chip or a board. For example, to trace a signal between a board and a chip, the chip position may be aligned with the board layout. Once the signal is traced to a pad of the chip, control may shift from the board layout analysis to the chip layout analysis. The chip layout analysis may continue tracing the signal. After signal tracing is completed, the full trace including the trace of the signal on the chip may be shown in a display of the board layout. A user may initiate a trace from a chip signal line, in which case tracing will continue to the chip boundary pad and then continue onto the board layout.

By searching through the possible signals and by determining signal connections from the chip to the board, the signal on the board may be identified. Once the signal is identified on the board, the process may include tracing the signal across the layout for the second package level. By way of example, the signal may be traced across the board level layout 140. When a signal is being traced across a chip, the process may include tracing the signal through active circuitry on a chip. The active circuitry may include transistors. The tracing of the signal may include tracing through a diffusion on a chip. The tracing of the signal may include tracing through a polysilicon shape on a chip. The signal may be traced to a logic gate input and the output of the logic gate may further be traced. In this manner, a whole cone of logic may be included in a tracing. Since the cone of logic may expand to multiple stages and outputs, more than one signal line may end up being traced as a result. When an output of a chip is traced backwards, there may be a cone of logic with multiple stages and inputs which may as a result be traced. The tracing through logic gates may use understood logical relationships or may use logic or transistor simulation. Other logical components such as adders, multipliers, and other logic operators may be traced through. Tracing may occur through active circuitry such as a transistor. A signal may reach the input of transistor gates. As a result, drain connections from transistors may be the output and the tracing may continue on a signal line attached to the transistor drains. Likewise signals may be traced through diffusion connections.

Signals may be traced through polysilicon lines. Signals may be traced through electrostatic discharge devices. The tracing may be based on understood electrical relationships based on the shape to which the signal is connected. Likewise the on-chip circuitry and shapes may be simulated through Spice or other similar types of simulators to determine connections and resulting tracing. Any manner of electrical structure may be traced through. The process may include simulating a portion of the first package level and a portion of the second package level. The process may include storing simulation results from the simulating the portion of the first package level and the portion of the second package level.

The process may include displaying a path of the signal across the layout of the first package level and the layout of the second package level. As the signals are being traced or after the signal tracing is complete, the signal path across the board and chip may be displayed 150. The process may include storing an image of the path of the signal on the first package level and the second package level. The process may include providing a three-dimensional display of the first package level and the second package level and the path of the signal which was traced.

Test equipment may be aligned, navigated around, and used to probe 160 the board. The test equipment may be aligned with the board. Using computer aided design (CAD) navigation software the tester or board may be moved in such a way to focus on different areas of the layout. A signal, or portion thereof, which was traced, may be used as a target to which to navigate the test equipment. The tester may probe certain locations on the signal which was traced in order to aid in determining a defect location. The process may include detecting a failure point for the signal. The failure may be an open, a short, or some erroneous connection to another portion of circuitry or wiring.

It will be understood that the terms chip and board may be interchanged in the preceding description of the tracing from one package level to another package level. Additionally, other package levels may be substituted for one or both of chip and board levels. FIG. 1 shows the tracing of a signal across a chip 120, identifying a signal on a board 130, and tracing the signal across a board 140. In other embodiments, the tracing may begin on a board, the identifying can be of a signal on a chip, and the tracing continue of the signal across a chip. Other combinations of tracing, identifying, and further tracing are possible for various package levels.

Figure 2:
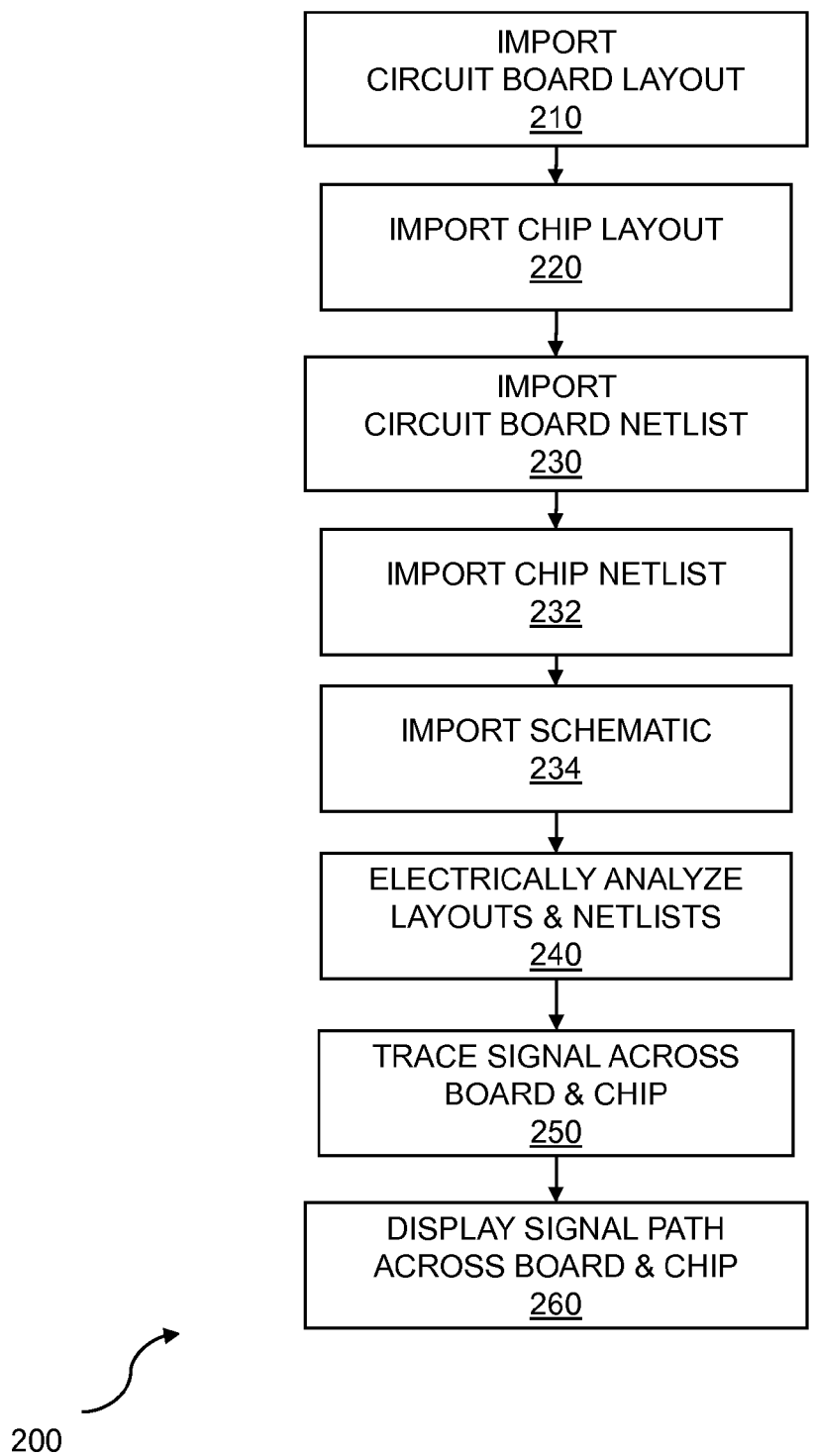
FIG. 2 is a flowchart for electrical analysis and tracing of signals across a board and chip.

FIG. 2 is a flowchart for electrical analysis and tracing of signals across a board and chip. The process 200 begins with importing of layout and one or more netlists. A board layout may be imported 210. A chip layout may be imported 220. The process may include importing 230 a netlist for one of the first package level and the second package level, and wherein the netlist represents a board. The process may include importing 232 a netlist, for one of the first package level and the second package level, and wherein the netlist is for a chip or a plurality of chips. The process may include importing 234 a schematic, for one of the first package level and the second package level. The schematic may be for a chip, a plurality of chips, a board, or the like. It will be understood that the layouts and netlists may be imported in any order. Further, it is possible that any of the layouts or netlists may have already resided in a software tool or just been generated as part of the design flow. Additionally, in some embodiments, only one netlist may be imported without departing from the disclosed concept.

The layouts, netlist(s), and schematics may be electrically analyzed 240. This analysis may include connectivity, logical levels and transitions, delay calculation, power consumption, or other aspects related to electrical analysis of logic and circuitry.

Signals may be traced across the chip(s) and board 250. A connection between a signal being traced on a chip and a signal line on a board may be found. Likewise a connection between a signal being traced on a board and a signal line on a chip may be found. One or more signal lines may be traced in this manner. The tracing may be done on the layout. The signal paths which were traced may be mapped to the corresponding netlist or schematic.

The signal path which was traced on the board and the chip may be displayed 260. In some embodiments, the signal path which was traced can be highlighted on the netlist and/or schematic. The signal path which is displayed may be used to aid in failure analysis and detection of one or more defects on the signal line.

Figure 3:
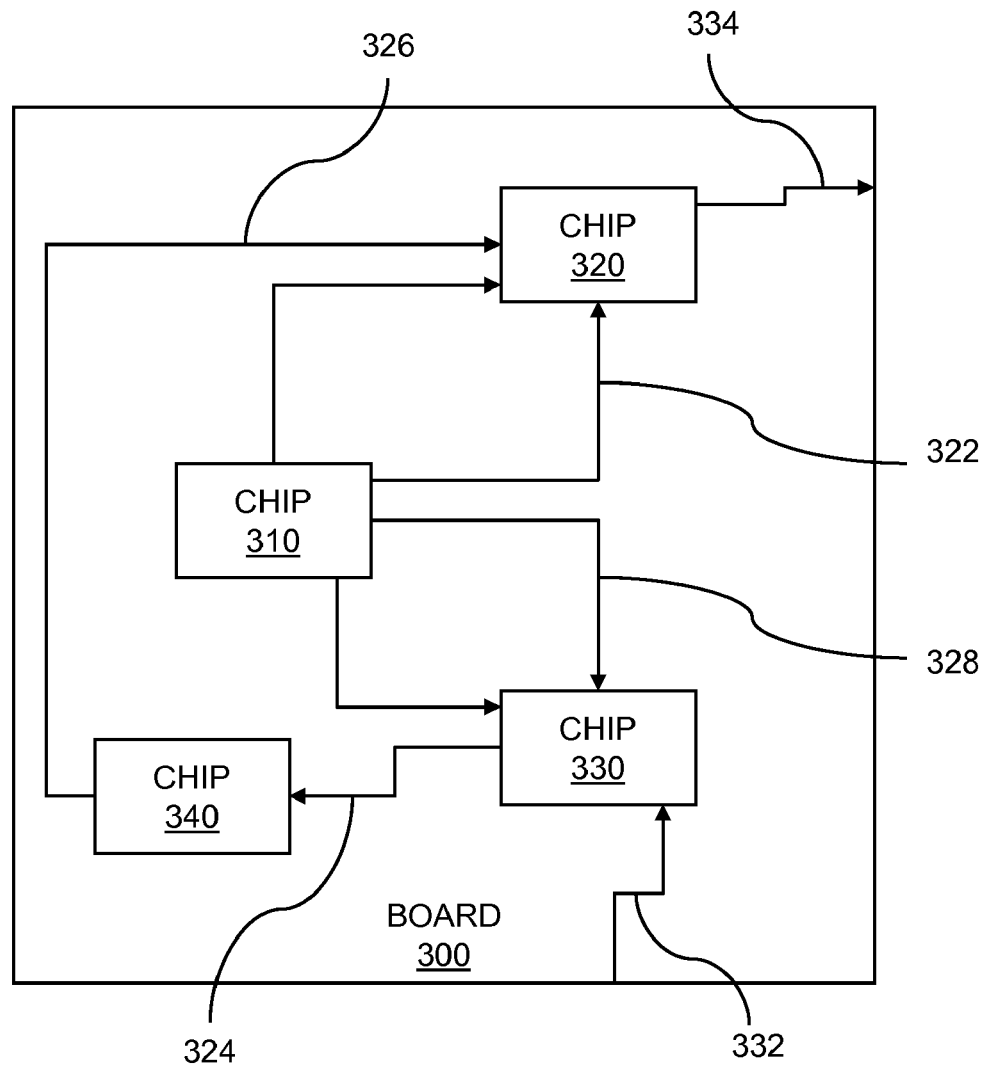
FIG. 3 is an example diagram of a board with interconnected chips.

FIG. 3 is an example diagram of a board with interconnected chips. A printed circuit board 300 may include chips 310, 320, 330, and 340. The board may have signal lines 322, 324, 326, 328, 332, 334, and others connecting the chips or connecting the board to inputs and outputs. There may be signals which feed onto the board, such as signal line 332, and signals which feed off of the board, such as signal line 334. A signal path may be traced from an input to a chip to an output of a chip, if there is a logical connection between the signals. For example signal line 332 may be connected to chip 330. Signal line 332 may be an input to logic within chip 330 which has an output of signal line 324. Signal line 324 may be connected to chip 340 and may drive logic within chip 340 which has an output of signal line 326. Signal line 326 may be connected to chip 320. Signal line 326 may be an input for logic within chip 320 which has signal line 334 as an output. Numerous other signal lines are possible. Some signal lines may be bidirectional, meaning that more than one chip may drive a signal line at different times. A signal line may be selected for tracing by a user. Forward looking tracing may be performed on a signal line. For example, if signal line 324 is selected for tracing then signal line 326 and 334 may be selected along with the signal lines and associate logic on chips 340 and 320. Backward looking tracing may be performed on a signal line. For example, if signal line 324 is selected then signal line 332 may be traced along with the associated logic on chip 330.

Figure 4:
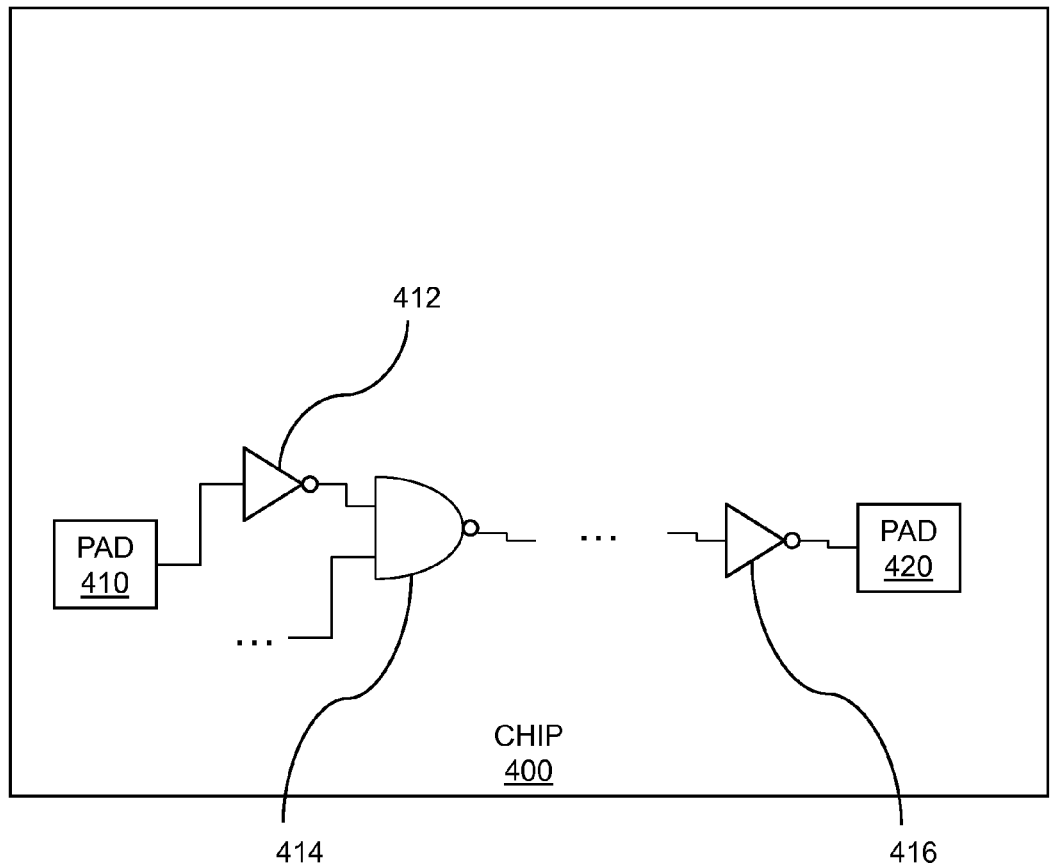
FIG. 4 is an example schematic diagram of a portion of a semiconductor chip.

FIG. 4 is an example schematic diagram of a portion of a semiconductor chip. Chip 400 may have an input pad 410 and an output pad 420. Chip 400 may further have inverters 412 and 416. Chip 400 may also have NAND gate 414. If a signal path is traced across a board on which chip 400 is mounted then tracing may continue across chip 400. A signal line may be traced across a board and identify as being connected to pad 410. Pad 410 may include an electrostatic discharge (ESD) or other support circuitry. Once pad 410 is identified as part of the signal trace, tracing may continue on chip. For example pad 410 may be identified as being connected through a signal line to inverter 412. Inverter 412 may be determined to be connected to a signal line which is in turn connected to NAND gate 414. The signal tracing may continue to be traced across chip 400. The signal path tracing may continue and eventually reach inverter 416. Inverter 416 may be determined to be connected to output pad 420. Signal tracing may be continued onto the board on which chip 400 is mounted. A connection may be found between pad 420 and a signal wire on the board. Other types of signal tracing may occur. The process may include identifying a cone of logic associated with the signal. Tracing may occur through other active circuitry such as transistors. The tracing of the signal may include tracing the signal through an electrostatic discharge protection device on the chip. Logic and transistor simulation may be used to perform electrical analysis. Signal tracing may lead a signal to a memory or other storage elements. Sequential simulation may be used to trace through a memory or storage element.

Figure 5:
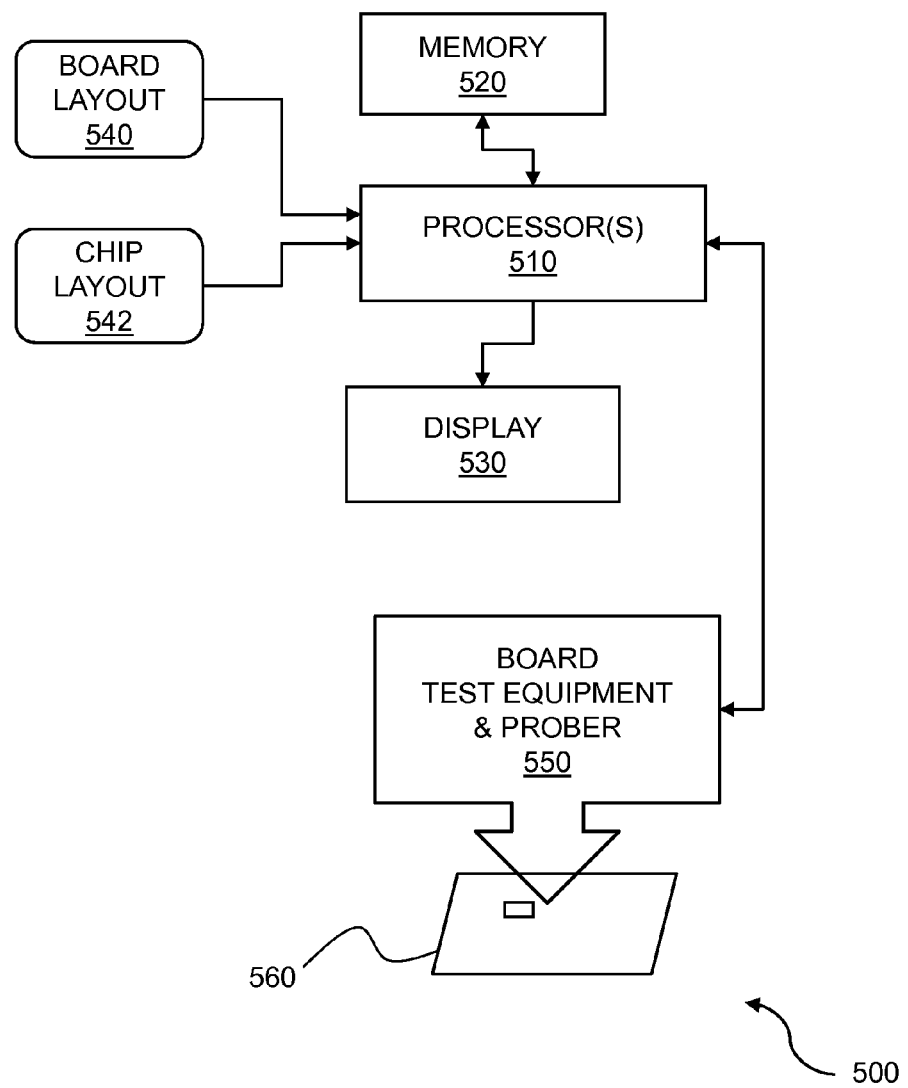
FIG. 5 is a diagram of a system for tracing signals across a board and chip.

FIG. 5 is a diagram of a system 500 for tracing signals across a board and chip. One or more processors 510 may communicate with memory 520. The memory 520 may store data on the layout, netlist, and other aspects of the board and chips. The memory 520 may store instructions for performing the failure analysis, for displaying information on defects, for tracing signals, and for operating tester equipment. The processor 510 may render information on a display 530. The display may be used to show the layout and images of the board along with tracing and defect information and other information key to performing failure analysis.

The processor 510 may read in board layout information 540 along with chip layout 542. The layouts 540 and 542 may include design dimensions and associated shapes. The layout information 540 and 542 may include modified shapes to aid in fabrication. The layouts 540 and 542 may include information on post-fabrication shapes. The processor 510 may also read in board and chip netlist information. The processor 510 may perform electrical analysis on the board and chips.

The processor 510 may trace a signal across the board. The processor 510 may aid in failure analysis of the board and chips and aid in identification of defect locations. The processor 510 may identify a connection between the signal being traced on the board and a signal on a chip. The processor 510 may further trace the signal across the chip. The processor may display tracing information on display 530.

It will be understood that tracing may be performed by system 500 without the presence of any test equipment. In some embodiments, however, processor 510 may be connected to test equipment 550. The processor 510 may interact with the test equipment 550. The test equipment may include a prober, stimulus generators, data loggers, and other components. The processor may provide instructions and settings for each of these components. The tester may move over a board 560 via CAD navigation. The tester may probe the board 560 or a chip that is mounted on the board. The test equipment may obtain visual images of the board and the signal lines on it. The visual images may be displayed on the display 530. Defects on the board 560 may be identified and displayed. The test equipment 550 may probe the board and points along a signal line being traced. The probing may help identify defect locations or electrical discontinuities along the signal line being traced.

Figure 6:
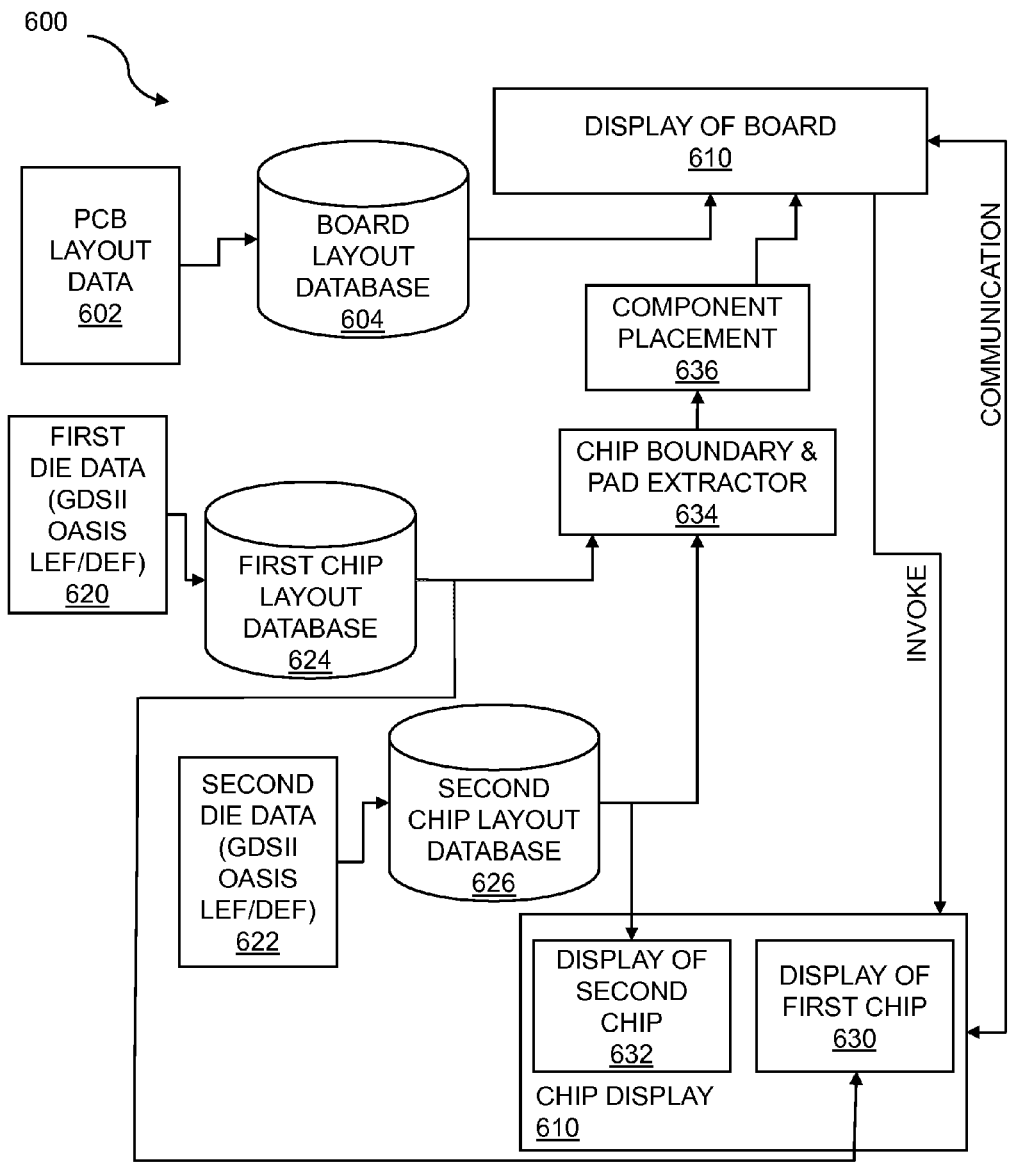
FIG. 6 is a diagram of a system for board and chip signal tracing.

FIG. 6 is a diagram of a system 600 for board and chip signal tracing. A printed circuit board layout 602 may be obtained and imported into a board layout database 604. The layout from the board may be viewed on a display 610. The board layout may be in Gerber or other layout format. A component on the board, such as a chip, may be viewed and a display of a chip may be invoked. Data 620 on a first chip (also known as a die) mounted on the board may be imported into a first chip layout database 624. The data on a chip may include layout in a GDS2, Oasis, Virtuoso, or other format. The data on the chip may include library exchange format (LEF) information and design exchange format (DEF) information including information on the logic gates such as input and output locations and layout for gates. The system may be able to view all descriptions of the electronic circuits on the board or chips. This and other information may be used to display 630 the chip which is mounted on the board. The chip display information may be communicated with the board display. Other chips may be displayed on the board such as second die data 622 may be imported into a second database 626 and displayed 632. In some embodiments, only a subset of the chips on a board may have information available through the chip databases. The process may include extracting chip boundary and chip pad circuitry 634 on one of the first package level and the second package level, for one or more chips on the board. The components, such as the one or more chips, may be placed on the board 636. There may be separate displays for the board and the chips. Alternatively, the chip display may occur within the board. The board and chips may be displayed in one window. Alternatively, a separate window may be opened for each of the board and chips displayed. A signal may be traced across a board and then as a signal line reaches one or more chip boundaries, the chip layouts with the associated signal tracing may be displayed. In some embodiments, a single database is used for multiple chips. In some embodiments, a single database is used for chips and boards. In embodiments, a single display is used for display of board and chip layout.

Figure 7:
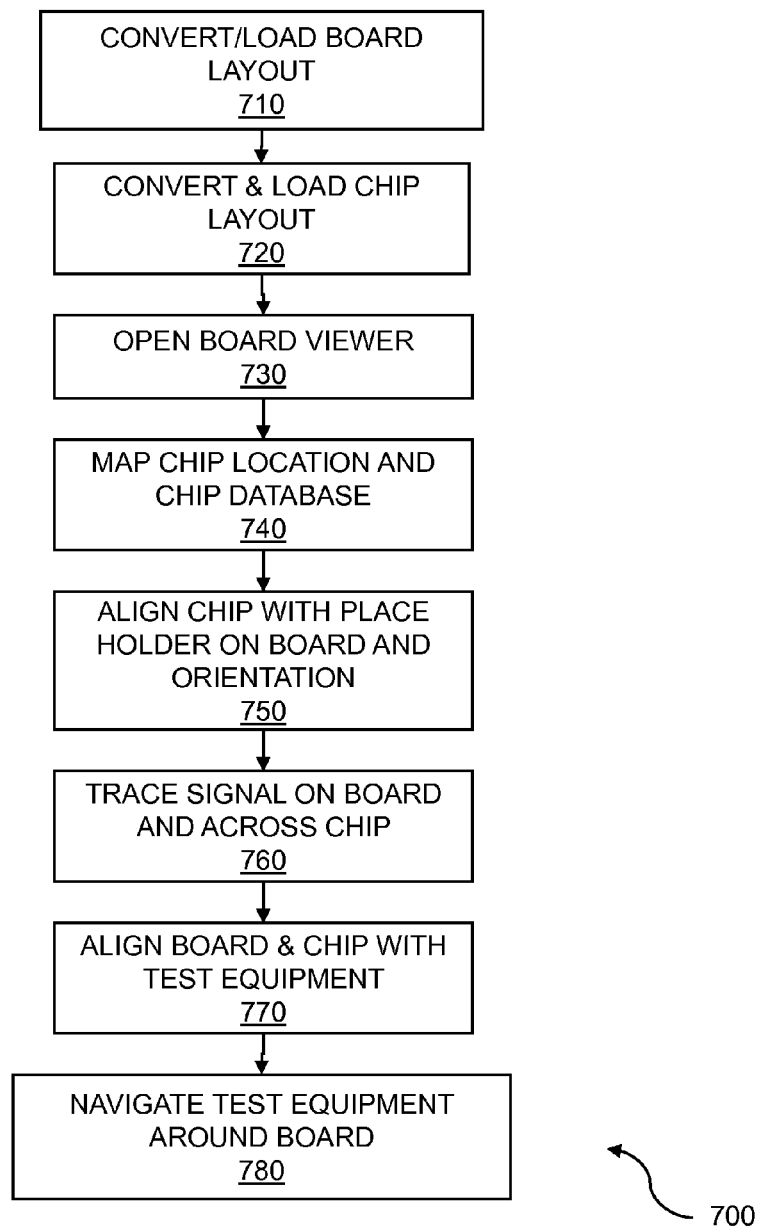
FIG. 7 is a flowchart for layout signal tracing.

FIG. 7 is a flowchart for layout signal tracing. The process 700 may begin by converting and loading a board layout 710. A printed circuit board layout may be imported into a software tool. If needed, the layout data may be converted to a common format used for both chip and board layout by the tool. Alternatively, the board layout may be used in its native format by the tool. A board may have ball grid array (BGA) contacts, bond wires, through-silicon vias (TSV), some combination thereof, or the like.

A chip layout may be loaded and/or converted 720. One or more chip layouts may be imported into the software tool. If needed, the layout data may be converted to a common format used for both chip and board layout by the tool. The layout format may be homogenous for both levels of packaging. The layout format can be a standard format or a proprietary format. Alternatively, the chip layout may be used in its native format by the tool. One or more chips mounted on the board may have their layouts imported and converted. It should be understood that the order of board and chip layout importing may be reversed or even be performed simultaneously without departing from the essence of the disclosed concept.

A board viewer may be opened 730. The layout tool for viewing the board and chip layout may be started.

The chip locations on the board may be mapped along with the database(s) for the chips 740. The locations for each of the chips mounted on the board may be identified. The information on each of the chips may be associated with the location where the chip is mounted.

The chip may be aligned with its associated chip location in its proper orientation on the board 750. A chip and its input/output pads may be aligned so that proper connects may be determined. The connections between the board and the chips may be found.

A signal may be traced across the board and across a chip 760. One or more chips may be traced through for a given signal. A user may disable or enable certain layers on the board or the chip for display.

In some embodiments, test equipment may be aligned with the board and its associated chips 770. The process may include aligning test equipment with the signal which was traced across a board. The test equipment may be oriented to the board through markers on the board or through chip locations.

The test equipment may be navigated around the board 780 for further inspection. The process may include navigating test equipment to inspect a potential failure point related to the signal. As a signal is traced, a possible defect location may be identified. The test equipment may be moved so that possible locations may be viewed. In some embodiments, the board is moved while the test equipment is stationary. In embodiments, the test equipment may probe the signal line to identify defective operation. The process may include probing the signal on a board. A FIB may be used to place probe points. The process may include using a focused ion beam to place a probe point on the signal on a board in order to facilitate testing. Electrical waveforms may be observed before and after the possible defect location. Electrical continuity may also be checked by the test equipment by probing on both sides of the possible defect and having the test inject a voltage or signal.

Each of the above methods may be executed using one or more processors on one or more computer systems. Embodiments may include various forms of distributed computing, client/server computing, and cloud based computing. Further, it will be understood that for each flow chart in this disclosure, the depicted steps or boxes are provided for purposes of illustration and explanation only. The steps may be modified, omitted, or re-ordered and other steps may be added without departing from the scope of this disclosure. Further, each step may contain one or more sub-steps. While the foregoing drawings and description set forth functional aspects of the disclosed systems, no particular arrangement of software and/or hardware for implementing these functional aspects should be inferred from these descriptions unless explicitly stated or otherwise clear from the context. All such arrangements of software and/or hardware are intended to fall within the scope of this disclosure.

The block diagrams and flowchart illustrations depict methods, apparatus, systems, and computer program products. Each element of the block diagrams and flowchart illustrations, as well as each respective combination of elements in the block diagrams and flowchart illustrations, illustrates a function, step or group of steps of the methods, apparatus, systems, computer program products and/or computer-implemented methods. Any and all such functions may be implemented by computer program instructions, by special-purpose hardware-based computer systems, by combinations of special purpose hardware and computer instructions, by combinations of general purpose hardware and computer instructions, by a computer system, and so on. Any and all of which may be generally referred to herein as a "circuit," "module," or "system."

A programmable apparatus which executes any of the above mentioned computer program products or computer implemented methods may include one or more processors, microprocessors, microcontrollers, embedded microcontrollers, programmable digital signal processors, programmable devices, programmable gate arrays, programmable array logic, memory devices, application specific integrated circuits, or the like. Each may be suitably employed or configured to process computer program instructions, execute computer logic, store computer data, and so on.

It will be understood that a computer may include a computer program product from a computer-readable storage medium and that this medium may be internal or external, removable and replaceable, or fixed. In addition, a computer may include a Basic Input/Output System (BIOS), firmware, an operating system, a database, or the like that may include, interface with, or support the software and hardware described herein.

Embodiments of the present invention are not limited to applications involving conventional computer programs or programmable apparatus that run them. It is contemplated, for example, that embodiments of the presently claimed invention could include an optical computer, quantum computer, analog computer, or the like. A computer program may be loaded onto a computer to produce a particular machine that may perform any and all of the depicted functions. This particular machine provides a means for carrying out any and all of the depicted functions.

Any combination of one or more computer readable media may be utilized. The computer readable medium may be a non-transitory computer readable medium for storage. A computer readable storage medium may be electronic, magnetic, optical, electromagnetic, infrared, semiconductor, or any suitable combination of the foregoing. Further computer readable storage medium examples may include an electrical connection having one or more wires, a portable computer diskette, a hard disk, a random access memory (RAM), a read-only memory (ROM), an erasable programmable read-only memory (EPROM), Flash, MRAM, FeRAM, phase change memory, an optical fiber, a portable compact disc read-only memory (CD-ROM), an optical storage device, a magnetic storage device, or any suitable combination of the foregoing. In the context of this document, a computer readable storage medium may be any tangible medium that can contain, or store a program for use by or in connection with an instruction execution system, apparatus, or device.

It will be appreciated that computer program instructions may include computer executable code. A variety of languages for expressing computer program instructions may include without limitation C, C++, Java, JavaScript™, ActionScript™, assembly language, Lisp, Perl, Tcl, Python, Ruby, hardware description languages, database programming languages, functional programming languages, imperative programming languages, and so on. In embodiments, computer program instructions may be stored, compiled, or interpreted to run on a computer, a programmable data processing apparatus, a heterogeneous combination of processors or processor architectures, and so on. Without limitation, embodiments of the present invention may take the form of web-based computer software, which includes client/server software, software-as-a-service, peer-to-peer software, or the like.

In embodiments, a computer may enable execution of computer program instructions including multiple programs or threads. The multiple programs or threads may be processed more or less simultaneously to enhance utilization of the processor and to facilitate substantially simultaneous functions. By way of implementation, any and all methods, program codes, program instructions, and the like described herein may be implemented in one or more thread. Each thread may spawn other threads, which may themselves have priorities associated with them. In some embodiments, a computer may process these threads based on priority or other order.

Unless explicitly stated or otherwise clear from the context, the verbs "execute" and "process" may be used interchangeably to indicate execute, process, interpret, compile, assemble, link, load, or a combination of the foregoing. Therefore, embodiments that execute or process computer program instructions, computer-executable code, or the like may act upon the instructions or code in any and all of the ways described. Further, the method steps shown are intended to include any suitable method of causing one or more parties or entities to perform the steps. The parties performing a step, or portion of a step, need not be located within a particular geographic location or country boundary. For instance, if an entity located within the United States causes a method step, or portion thereof, to be performed outside of the United States then the method is considered to be performed in the United States by virtue of the entity causing the step to be performed.

While the invention has been disclosed in connection with preferred embodiments shown and described in detail, various modifications and improvements thereon will become apparent to those skilled in the art. Accordingly, the spirit and scope of the present invention is not to be limited by the foregoing examples, but is to be understood in the broadest sense allowable by law.

What is claimed is:

1. A computer implemented method for failure analyzing circuit boards comprising:
   importing a first layout for a first package level;
   importing a second layout for a second package level, wherein the second package level includes an electrical attachment to the first package level;
   tracing a signal path across the first layout through the electrical attachment and across the second layout; and
   displaying the signal path.

2. The method of claim 1 wherein the first package level includes a printed circuit board.

3. The method of claim 2 wherein the second package level includes a semiconductor chip.

4. The method of claim 1 wherein the first package level includes a semiconductor chip.

5. The method of claim 4 wherein the second package level includes a printed circuit board.

6. The method of claim 1 wherein the tracing the signal path includes tracing the signal path through active circuitry on a chip.

7. The method of claim 6 wherein the active circuitry includes a transistor.

8. The method of claim 1 wherein the tracing the signal path includes tracing the signal path through a diffusion on a chip.

9. The method of claim 1 wherein the tracing the signal path includes tracing the signal path through a polysilicon element on a chip.

10. The method of claim 1 wherein the tracing the signal path includes tracing the signal path through an electrostatic discharge protection device.

11. The method of claim 1 further comprising identifying a cone of logic associated with the signal path and displaying the cone of logic.

12. The method of claim 1 further comprising importing a netlist, for one of the first package level and the second package level, wherein the netlist is for a board and highlighting the signal path that was traced.

13. The method of claim 1 further comprising importing a netlist, for one of the first package level and the second package level, wherein the netlist is for a chip and highlighting the signal path that was traced.

14. The method of claim 1 further comprising importing a schematic, for one of the first package level and the second package level, and highlighting the signal path that was traced.

15. The method of claim 1 further comprising tracing the signal path through a stacked chip package wherein the first package level and the second package level comprise the stacked chip package.

16. The method of claim 1 further comprising extracting chip boundary and chip pad circuitry on one of the first package level and the second package level.

17. The method of claim 1 further comprising simulating a portion of the first package level and a portion of the second package level.

18. The method of claim 1 further comprising probing a signal line on a board wherein the signal line is part of the signal path.

19. The method of claim 1 further comprising providing a three-dimensional display of the first package level and the second package level and the signal path which was traced.

20. The method of claim 1 further comprising detecting a failure point for the signal path.

21. A computer program product embodied in a non-transitory computer readable medium for performing circuit board analysis comprising:
   code for importing a first layout for a first package level;
   code for importing a second layout for a second package level, wherein the second package level includes an electrical attachment to the first package level;
   code for tracing a signal path across the first layout through the electrical attachment and across the second layout; and
   code for displaying the signal path.

22. The computer program product of claim 21 further comprising code for identifying a cone of logic associated with the signal path and displaying the cone of logic.

23. The computer program product of claim 21 further comprising code for importing a netlist, for one of the first package level and the second package level, wherein the netlist is for a board and highlighting the signal path that was traced.

24. The computer program product of claim 21 further comprising code for importing a netlist, for one of the first package level and the second package level, wherein the netlist is for a chip and highlighting the signal path that was traced.

25. The computer program product of claim 21 further comprising code for importing a schematic, for one of the first package level and the second package level, and highlighting the signal path that was traced.

26. The computer program product of claim 21 further comprising code for tracing the signal path through a stacked chip package wherein the first package level and the second package level comprise the stacked chip package.

27. The computer program product of claim 21 further comprising code for extracting chip boundary and chip pad circuitry on one of the first package level and the second package level.

28. The computer program product of claim 21 further comprising code for providing a three-dimensional display of the first package level and the second package level and the signal path which was traced.

29. The computer program product of claim 21 further comprising code for detecting a failure point for the signal path.

30. A system for performing circuit board analysis comprising:
   a memory for storing instructions;
   one or more processors attached to the memory wherein the one or more processors are configured to:
   import a first layout for a first package level;
   import a second layout for a second package level, wherein the second package level includes an electrical attachment to the first package level;
   trace a signal path across the first layout through the electrical attachment and across the second layout; and
   display the signal path.

31. The system of claim 30 wherein the one or more processors are further configured to identify a cone of logic associated with the signal path and displaying the cone of logic.

32. The system of claim 30 wherein the one or more processors are further configured to import a netlist, for one of the first package level and the second package level, wherein the netlist is for a board and highlighting the signal path that was traced.

33. The system of claim 30 wherein the one or more processors are further configured to import a netlist, for one of the first package level and the second package level, wherein the netlist is for a chip and highlighting the signal path that was traced.

34. The system of claim 30 wherein the one or more processors are further configured to import a schematic, for one of the first package level and the second package level, and highlighting the signal path that was traced.

35. The system of claim 30 wherein the one or more processors are further configured to trace the signal path through a stacked chip package wherein the first package level and the second package level comprise the stacked chip package.

36. The system of claim 30 wherein the one or more processors are further configured to extract chip boundary and chip pad circuitry on one of the first package level and the second package level.

37. The system of claim 30 wherein the one or more processors are further configured to provide a three-dimensional display of the first package level and the second package level and the signal path which was traced.

38. The system of claim 30 wherein the one or more processors are further configured to detect a failure point for the signal path.

* * * * *